United States Patent
Fujita et al.

(10) Patent No.: US 10,770,420 B2
(45) Date of Patent: Sep. 8, 2020

(54) SEMICONDUCTOR DEVICE

(71) Applicant: Mitsubishi Electric Corporation, Tokyo (JP)

(72) Inventors: Shigeto Fujita, Tokyo (JP); Takashi Inaguchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/095,387

(22) PCT Filed: Sep. 7, 2016

(86) PCT No.: PCT/JP2016/076331
§ 371 (c)(1),
(2) Date: Oct. 22, 2018

(87) PCT Pub. No.: WO2018/047257
PCT Pub. Date: Mar. 15, 2018

(65) Prior Publication Data
US 2020/0035640 A1  Jan. 30, 2020

(51) Int. Cl.
*H01L 23/00* (2006.01)
*H01L 25/07* (2006.01)

(52) U.S. Cl.
CPC ........... *H01L 24/72* (2013.01); *H01L 25/071* (2013.01); *H01L 2924/1033* (2013.01);
(Continued)

(58) Field of Classification Search
None
See application file for complete search history.

(56) References Cited

U.S. PATENT DOCUMENTS 9,852,968 B2 * 12/2017 Nashida ............ H01L 23/4334
2004/0207070 A1  10/2004 Kaufmann et al.
(Continued)

FOREIGN PATENT DOCUMENTS

JP    2004-528724 A    9/2004
JP    2006-500774 A    1/2006
(Continued)

OTHER PUBLICATIONS

An Office Action mailed by the Japanese Patent Office dated Oct. 29, 2019, which corresponds to Japanese Patent Application No. 2018-537921 and is related to U.S. Appl. No. 16/095,387.
(Continued)

*Primary Examiner* — Zandra V Smith
*Assistant Examiner* — Andre C Stevenson
(74) *Attorney, Agent, or Firm* — Studebaker & Brackett PC

(57) ABSTRACT

A lower electrode, an upper electrode provided above the lower electrode, a semiconductor chip provided between the lower electrode and the upper electrode, a pressure pad provided between the lower electrode and the upper electrode to be overlapped with the semiconductor chip, and a spiral conductor provided between the lower electrode and the upper electrode to be overlapped with the semiconductor chip and the pressure pad are provided. The spiral conductor has an upper spiral conductor, and a lower spiral conductor which is in contact with a lower end of the upper spiral conductor and faces the upper spiral conductor, and by forming grooves in the upper spiral conductor and the lower spiral conductor, a direction of a current flowing through the upper spiral conductor coincides with a direction of a current flowing through the lower spiral conductor in plan view.

15 Claims, 7 Drawing Sheets

(52) U.S. Cl.
CPC .............. *H01L 2924/10254* (2013.01); *H01L 2924/10272* (2013.01); *H01L 2924/1203* (2013.01); *H01L 2924/13055* (2013.01)

(56) References Cited

U.S. PATENT DOCUMENTS

| | | |
|---|---|---|
| 2006/0118816 A1 | 6/2006 | Gunturi et al. |
| 2014/0225245 A1* | 8/2014 | Dugal .................. H01L 23/051 |
| | | 257/688 |
| 2016/0329264 A1 | 11/2016 | Ekwall et al. |

FOREIGN PATENT DOCUMENTS

| | | | |
|---|---|---|---|
| JP | 2010-251079 A | | 11/2010 |
| JP | 2010251079 | * | 11/2010 |
| JP | 2014-157924 A | | 8/2014 |
| JP | 2014-531133 A | | 11/2014 |
| JP | 2016-500474 A | | 1/2016 |

OTHER PUBLICATIONS

International Search Report issued in PCT/JP2016/076331; dated Nov. 8, 2016.
Written Opinion issued in PCT/JP2016/076331; dated Nov. 8, 2016.
Notification of Transmittal of the International Search Report and the Written Opinion of the International Searching Authority, or the Declaration issued in PCT/JP2016/076331; dated Nov. 8, 2016.

* cited by examiner

SEMICONDUCTOR DEVICE

FIELD

The present invention relates to a semiconductor device used, for example, for switching large current or the like.

BACKGROUND

PTL 1 discloses a press-pack power semiconductor module. PTL 1 discloses, in FIG. 1, a press-pack power semiconductor module having a plurality of semiconductor devices inside. One semiconductor device has one semiconductor chip. The semiconductor chip is, for example, an IGBT. Electric connection in the semiconductor chip is realized by press contact of the upper surfaces and the lower surfaces of individual elements of the semiconductor device. In order to evenly exert pressure on the plurality of semiconductor chips, a spring structure and play in an electric conduction path are needed for each semiconductor chip.

A pressure pad affords this play and secures the electric connection. A plurality of pressure pads are occasionally provided in order to increase current-carrying capacity for normal current. A spring is occasionally provided between the pressure pads, it functions as inductance even when it has conductivity, and it has high impedance particularly for high frequency waves. Therefore, current does not flow through the spring.

PRIOR ART

Patent Literature

Patent Literature 1: JP 2004-528724 A

SUMMARY

Technical Problem

When the semiconductor chip is in the short circuit state, currents in the opposite directions flow through an upper electrode which is an upper bus bar and a lower electrode which is a lower bus bar. Electromagnetic force due to these currents causes repulsive force to arise between the upper electrode and the lower electrode. When the repulsive force causes the distance between the upper electrode and the lower electrode to become larger, peeling-off of a component between the upper electrode and the lower electrode occasionally occurs, so that the electric path therebetween breaks. In particular, there is a risk of peeling-off on the surface of the semiconductor chip with weak connection performance.

Further, it is considered that an electric arc is generated at the site of the electric path breaking and the device is heated due to the arc, and thereby, that an atmosphere therein expands or a solid therein is vaporized to cause its explosion. Therefore, a module needs a robust explosion-proof structure, which has been a factor of prohibiting downsizing thereof and low costs thereof. There are also occasionally needed restriction of a region of service current and/or separately providing a short-circuit protection.

The present invention is devised in order to solve the aforementioned problems, and an object thereof is to provide a semiconductor device capable of reducing repulsive force exerted on an upper electrode and a lower electrode to prevent peeling-off of a component between the upper electrode and the lower electrode.

Means for Solving the Problems

According to a present invention, a semiconductor device includes a lower electrode, an upper electrode provided above the lower electrode, a semiconductor chip provided between the lower electrode and the upper electrode, a pressure pad provided between the lower electrode and the upper electrode to be overlapped with the semiconductor chip, and a spiral conductor provided between the lower electrode and the upper electrode to be overlapped with the semiconductor chip and the pressure pad, wherein the spiral conductor has an upper spiral conductor, and a lower spiral conductor which is in contact with a lower end of the upper spiral conductor and faces the upper spiral conductor, and by forming grooves in the upper spiral conductor and the lower spiral conductor, a direction of a current flowing through the upper spiral conductor coincides with a direction of a current flowing through the lower spiral conductor in plan view.

Other features of the invention will appear more fully from the following description.

Advantageous Effects of Invention

According to the present invention, since attractive force generated in the spiral conductor reduces repulsive force exerted on the lower electrode and the upper electrode, peeling-off of a component between the upper electrode and the lower electrode can be prevented.

DESCRIPTION OF EMBODIMENTS

Semiconductor devices according to embodiments of the present invention are described with reference to the drawings. The same or corresponding components are given the same signs and their duplicate description is occasionally omitted.

Embodiment 1

Figure 1:
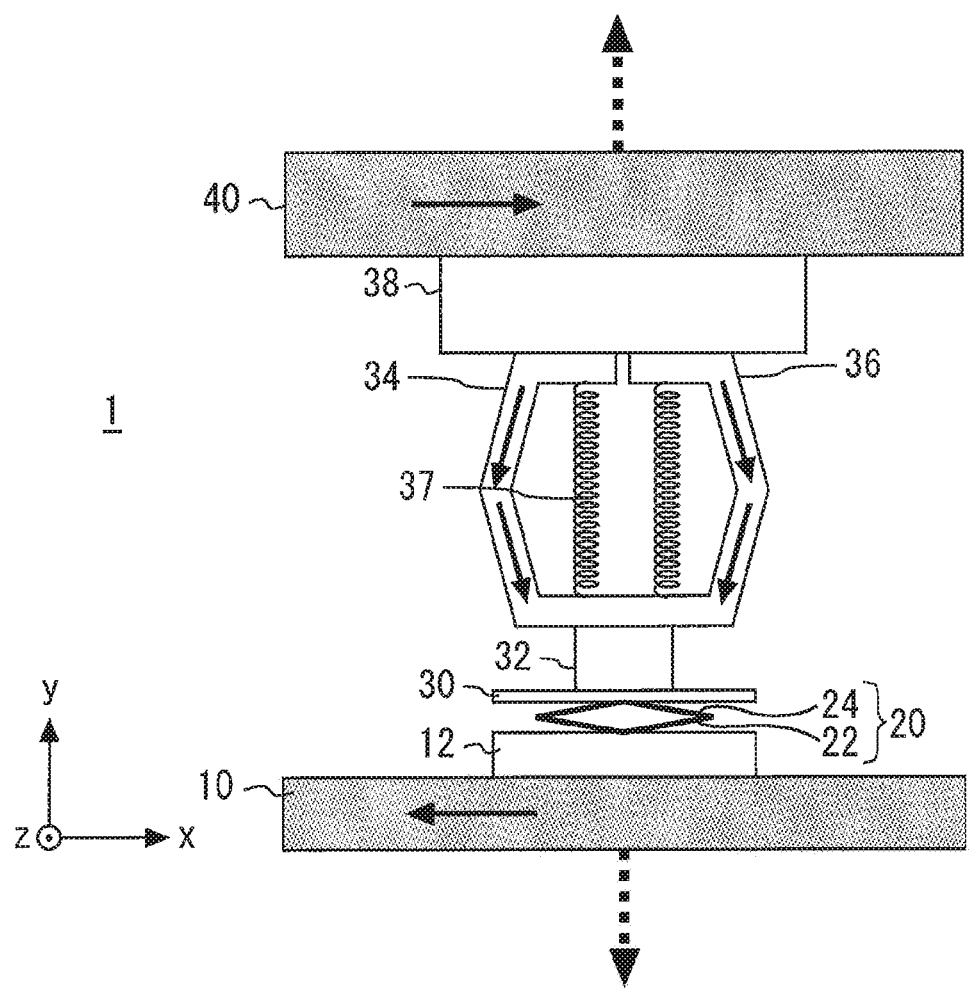
FIG. 1 is a cross-sectional view of a semiconductor device according to Embodiment 1.

FIG. 1 is a cross-sectional view of a semiconductor device according to Embodiment 1. This semiconductor device 1 includes a lower electrode 10. A semiconductor chip 12 is provided on the lower electrode 10. The semiconductor chip 12 is, for example, an IGBT or a diode. A spiral conductor 20 is provided on the semiconductor chip 12. The spiral conductor 20 has a lower spiral conductor 22 and an upper spiral conductor 24.

Plates 30 and 32 formed of metal are provided to be overlapped on the spiral conductor 20. Pressure pads 34 and 36 provided on the plate 32. The semiconductor device 1 has the pressure pads 34 and 36, and thereby, they constitute a spring electrode of a press-pack power semiconductor device. A plate 38 is provided on the pressure pads 34 and 36, and an upper electrode 40 is provided on the plate 38.

The upper ends of the pressure pads 34 and 36 are fixed to the plate 38, and the lower ends thereof are fixed to the plate 32. The pressure pads 34 and 36 can expand and contract in the y-direction, that is, in the direction perpendicular to the lower surface of the lower electrode 10 and the upper surface of the upper electrode 40. Therefore, the pressure pads 34 and 36 electrically connect the lower electrode 10 and the upper electrode 40 together via the semiconductor chip 12 regardless of the distance between the lower electrode 10 and the upper electrode 40.

Springs 37 are provided between the pressure pads 34 and 36. The springs 37 exert force which decreases the distance between the lower electrode 10 and the upper electrode 40 when the distance between the lower electrode 10 and the upper electrode 40 increases, and exerts force which increases the distance between the lower electrode 10 and the upper electrode 40 when the distance between the lower electrode 10 and the upper electrode 40 decreases.

The individual elements between the lower electrode 10 and the upper electrode 40 are preferably brought into press contact with one another. Thereby, electric connection between the upper electrode 40 and the lower electrode 10 can be secured via the semiconductor chip 12, the pressure pads 34 and 36, and the like.

Figure 2:
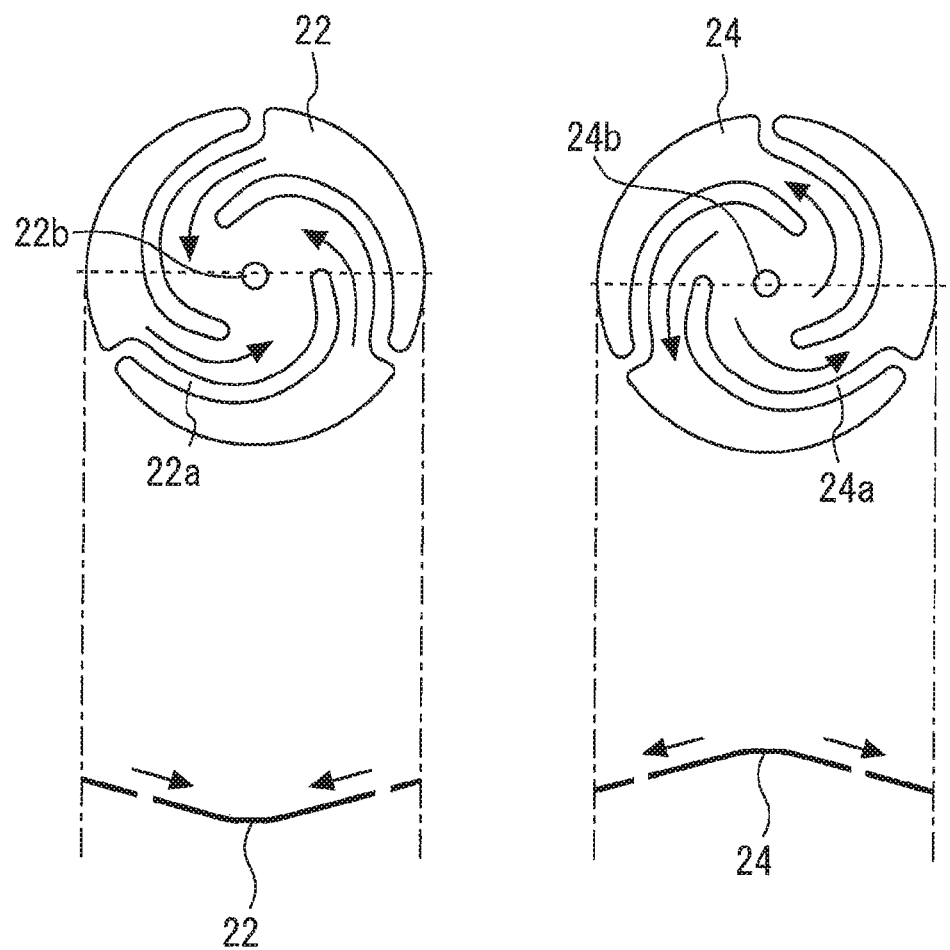
FIG. 2 is a diagram illustrating the lower spiral conductor and the upper spiral conductor.

FIG. 2 is a diagram illustrating the lower spiral conductor 22 and the upper spiral conductor 24. The top left view is a plan view of the lower spiral conductor 22, and the cross-sectional view taken along the broken line in this view is the bottom left view. The top right view is a plan view of the upper spiral conductor 24, and the cross-sectional view taken along the broken line in this view is the bottom right view. The lower spiral conductor 22 and the upper spiral conductor 24 have the same shapes. Namely, by the lower spiral conductor 22 reversed upside down, it has the same shape as that of the upper spiral conductor.

Arrows in FIG. 2 indicate flows of currents. In the lower spiral conductor 22, basically, currents flow inward from the outside of the lower spiral conductor 22. Further, curved grooves 22a are formed in the lower spiral conductor 22. The plurality of grooves 22a are annular as a whole. These grooves 22a establish the flows of the currents. As a result, in the lower spiral conductor 22, the currents flow in the counterclockwise direction in plan view.

Meanwhile, in the upper spiral conductor 24, basically, currents flow outward from the inside of the upper spiral conductor 24. Further, curved grooves 24a are formed in the upper spiral conductor 24. The plurality of grooves 24a are annular as a whole. These grooves 24a establish the flows of the currents. As a result, in the upper spiral conductor 24, the currents flow in the counterclockwise direction in plan view.

As above, by forming the grooves 22a and 24a in the lower spiral conductor 22 and the upper spiral conductor 24, the direction of the currents flowing through the upper spiral conductor 24 coincides with the direction of the currents flowing through the lower spiral conductor 22 in plan view.

As apparent from the two lower views in FIG. 2, both the lower spiral conductor 22 and the upper spiral conductor 24 have conical shapes in which the center part rises. The lower spiral conductor 22 is convex downward, and the upper spiral conductor 24 is convex upward. An opening 22b at the center of the lower spiral conductor 22 is provided in order that the lower spiral conductor 22 can easily come into contact with the semiconductor chip 12. An opening 24b at the center of the upper spiral conductor 24 is provided in order that the upper spiral conductor 24 can easily come into contact with the plate 30.

Figure 3:
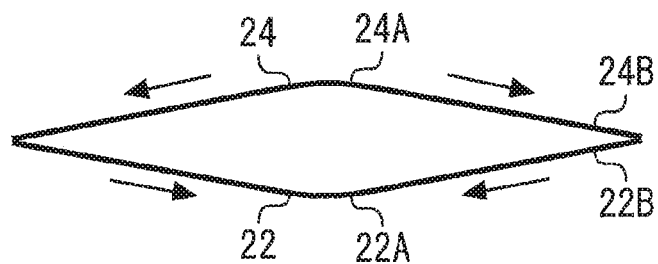
FIG. 3 is a cross-sectional view of the spiral conductor.

FIG. 3 is a cross-sectional view of the spiral conductor 20. The upper spiral conductor 24 and the lower spiral conductor 22 are provided to face each other. The lower end of the upper spiral conductor 24 is in contact with the upper end of the lower spiral conductor 22, and thereby, they constitute the spiral conductor 20. As apparent from FIG. 3, a portion of the upper spiral conductor 24 that has the largest width is in contact with a portion of the lower spiral conductor 22 that has the largest width. Further, in cross-sectional view of those, the currents flow from a center 24A of the upper spiral conductor 24 to an outside 24B thereof, the currents flow from an outside 22B of the lower spiral conductor 22 to a center 22A thereof, and the currents flow to the semiconductor chip 12.

Figure 4:
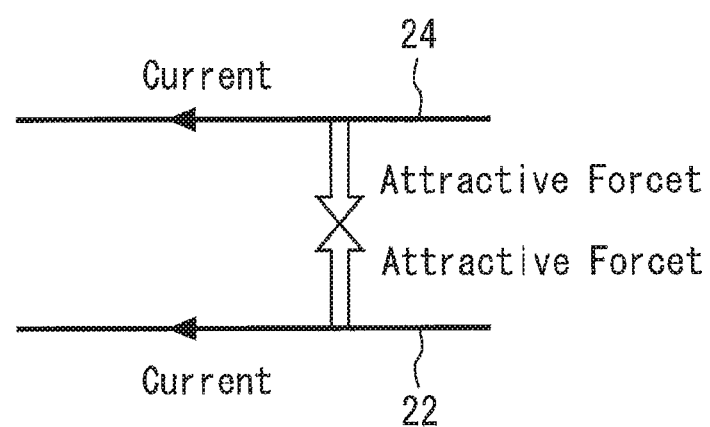
FIG. 4 is a partial cross-sectional view of the lower spiral conductor and the upper spiral conductor.
Figure 5:
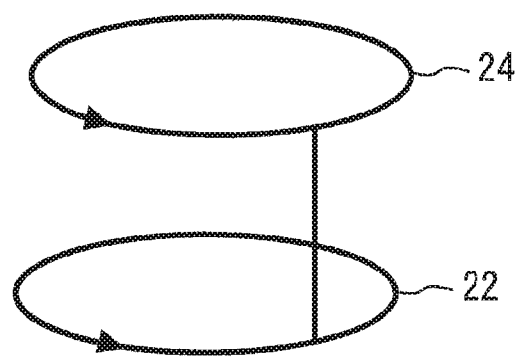
FIG. 5 is diagram schematically illustrating flows of currents in the spiral conductor.

FIG. 4 is a partial cross-sectional view of the lower spiral conductor 22 and the upper spiral conductor 24. Since as mentioned above, the direction of the currents flowing through the lower spiral conductor 22 coincides with the direction of the currents flowing through the upper spiral conductor 24, attractive force arises between the lower spiral conductor 22 and the upper spiral conductor 24. FIG. 5 is a diagram schematically illustrating flows of currents in the lower spiral conductor 22 and the upper spiral conductor 24. By counterclockwise currents arising in the lower spiral conductor 22 and the upper spiral conductor 24, attractive force arises between these.

Figure 6:
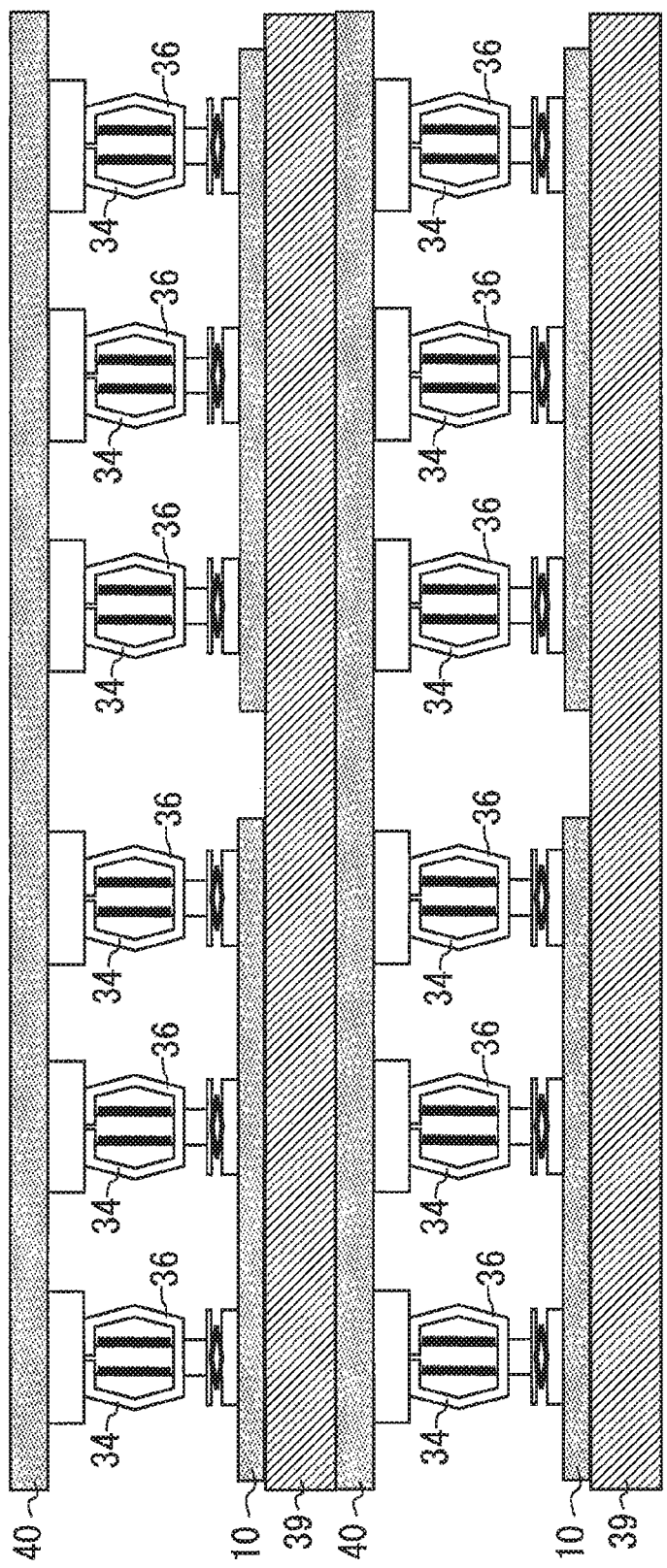
FIG. 6 is a diagram exemplarily illustrating assembly of the semiconductor devices according to Embodiment 1.

FIG. 6 is a diagram exemplarily illustrating assembly of the semiconductor devices 1 according to Embodiment 1. Three semiconductor devices 1 share one lower electrode 10. Six semiconductor devices 1 are arranged on a base plate 39. FIG. 6 illustrates stacking two structures in each of which six semiconductor devices 1 are mounted on the base plate 39. Thereby, a press-pack power semiconductor module having twelve semiconductor devices 1 is configured. Force is exerted on this module from the top and the bottom of the module and the individual elements in the semiconductor devices are brought into press contact with one another, and thereby, electric connections in the semiconductor chips are realized.

In order to evenly exert pressure on the plurality of semiconductor chips 12, there are needed a spring structure and play in an electric conduction path for each semiconductor device 1. The pressure pads 34 and 36 afford this play and secure the electric connection. While in Embodiment 1, the two pressure pads 34 and 36 are provided in one semiconductor device, three or more pressure pads for one semiconductor device may be provided in order to increase the current-carrying capacity for normal current. Notably, since the springs 37 between the pressure pads 34 and 36 function as inductance even when they have conductivity, they have high impedance particularly for high frequency waves, and current does not flow through the springs 37.

Now, solid arrows in FIG. 1 indicate directions of short circuit currents. Short circuit currents in the opposite directions flow through the upper electrode 40 which is an upper bus bar and the lower electrode 10 which is a lower bus bar.

These short circuit currents cause repulsive force to arise between the upper electrode 40 and the lower electrode 10. Broken arrows indicate the repulsive force. Further, since in the semiconductor device 1 according to Embodiment 1 of the present invention, the attractive force arises between the lower spiral conductor 22 and the upper spiral conductor 24 as mentioned above, the attractive force cancels or reduces the repulsive force arising between the upper electrode 40 and the lower electrode 10.

As above, by reducing the repulsive force exerted on the upper electrode 40 and the lower electrode 10, peeling-off of a component between the upper electrode 40 and the lower electrode 10 can be prevented. For example, the semiconductor chip 12 can be prevented from peeling off from the lower electrode 10. Such prevention of peeling-off does not cause thermal expansion of an atmosphere due to an electric arc, and hence, the semiconductor device and the module including the same are not to explode. Therefore, an explosion-proof measure conventionally provided can be removed, which can realize downsizing and low costs of the module.

In the semiconductor device according to Embodiment 1 of the present invention, the semiconductor chip 12, the pressure pads 34 and 36 provided to be overlapped with the semiconductor chip 12, and the spiral conductor 20 provided to be overlapped with the semiconductor chip 12 and the pressure pads 34 and 36 are provided between the lower electrode 10 and the upper electrode 40, and attractive force is generated in the spiral conductor 20. Various modifications of the semiconductor device 1 according to Embodiment 1 of the present invention may occur as long as they do not lose its features.

For example, the stacking order of the semiconductor chip 12, the pressure pads 34 and 36 and the spiral conductor 20 may be changed. Therefore, the semiconductor chip 12 can be provided above the pressure pads 34 and 36. Moreover, the number of pressure pads provided in one semiconductor device 1 is not specially limited. As the semiconductor chip 12, a vertical chip in which current flows between its front surface and rear surface can be used, and such a chip is not limited to an IGBT or a diode.

While the semiconductor chip 12 may be formed of silicon, it may be formed of a wide bandgap semiconductor larger in bandgap than silicon. Examples of the wide bandgap semiconductor include silicon carbide, a gallium nitride-based material, and diamond. By using the wide bandgap semiconductor, the operable temperature of the device increases. Furthermore, silicon carbide allows a MOSFET, which is a monopolar device, to have a high withstand voltage, which can achieve a high frequency and high efficiency.

These modifications can also apply to semiconductor devices according to the following embodiments. Notably, since the semiconductor devices according to the following embodiments have much resemblance to that of Embodiment 1, their differences from that of Embodiment 1 will be mainly described.

Embodiment 2

Figure 7:
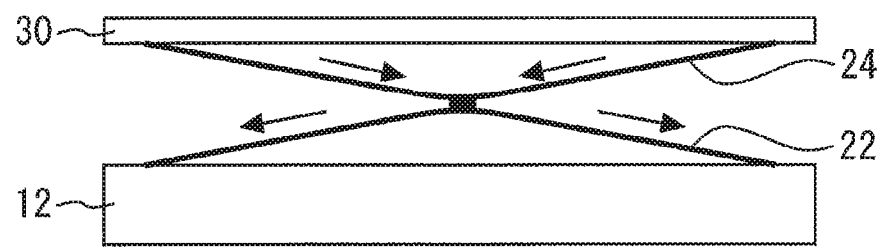
FIG. 7 is a cross-sectional view of a spiral conductor of a semiconductor device according to Embodiment 2.

FIG. 7 is a cross-sectional view of a spiral conductor of a semiconductor device according to Embodiment 2. A portion of the upper spiral conductor 24 that has the smallest width is in contact with a portion of the lower spiral conductor 22 that has the smallest width. Namely, the center of the lower spiral conductor 22 is in contact with the center of the upper spiral conductor 24. In this case, current enters the outside of the upper spiral conductor 24 from the outside of the plate 30, reaches the center of the upper spiral conductor 24, flows outward from the center of the lower spiral conductor 22, and enters the semiconductor chip 12.

In plan view, clockwise currents are to arise in the upper spiral conductor 24 and the lower spiral conductor 22. In other words, since in plan view, the direction of currents flowing through the upper spiral conductor 24 coincides with the direction of currents flowing through the lower spiral conductor 22, attractive force arises between the upper spiral conductor 24 and the lower spiral conductor 22. Since this attractive force reduces the repulsive force exerted on the upper electrode 40 and the lower electrode 10, peeling-off of a component between the upper electrode 40 and the lower electrode 10 can be prevented.

Embodiment 3

Figure 8:
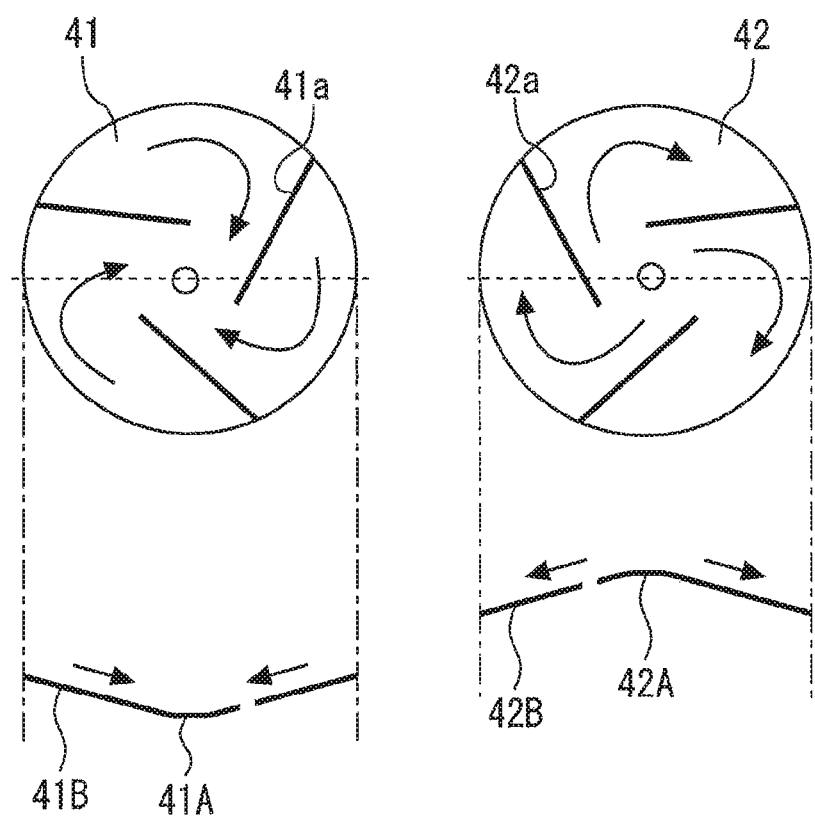
FIG. 8 is a diagram illustrating a lower spiral conductor and an upper spiral conductor of a semiconductor device according to Embodiment 3.

FIG. 8 is a diagram illustrating a lower spiral conductor 41 and an upper spiral conductor 42 of a semiconductor device according to Embodiment 3. The top left view is a plan view of the lower spiral conductor 41, and the cross-sectional view taken along the broken line in this view is the bottom left view. The top right view is a plan view of the upper spiral conductor 42, and the cross-sectional view taken along the broken line in this view is the bottom right view. The lower spiral conductor 41 and the upper spiral conductor 42 have the same shapes. Namely, by the lower spiral conductor 41 reversed upside down, it has the same shape as that of the upper spiral conductor 42. The upper end of the lower spiral conductor 41 is connected to the lower end of the upper spiral conductor 42, and thereby, they constitute a spiral conductor.

Both grooves 41a of the lower spiral conductor 41 and grooves 42a of the upper spiral conductor 42 are formed to be linear. In this case, by only cutting grooves through a disc which is followed by deformation of the disc into a convex shape, each of the lower spiral conductor 41 and the upper spiral conductor 42 can be simply formed.

By a current path limited by the grooves 41a, currents flow counterclockwise through the lower spiral conductor 41. By a current path limited by the grooves 42a, currents flow counterclockwise through the upper spiral conductor 42. Therefore, attractive force arises between the upper spiral conductor 42 and the lower spiral conductor 41. Since this attractive force reduces the repulsive force exerted on the upper electrode 40 and the lower electrode 10, peeling-off of a component between the upper electrode 40 and the lower electrode 10 can be prevented.

Embodiment 4

Figure 9:
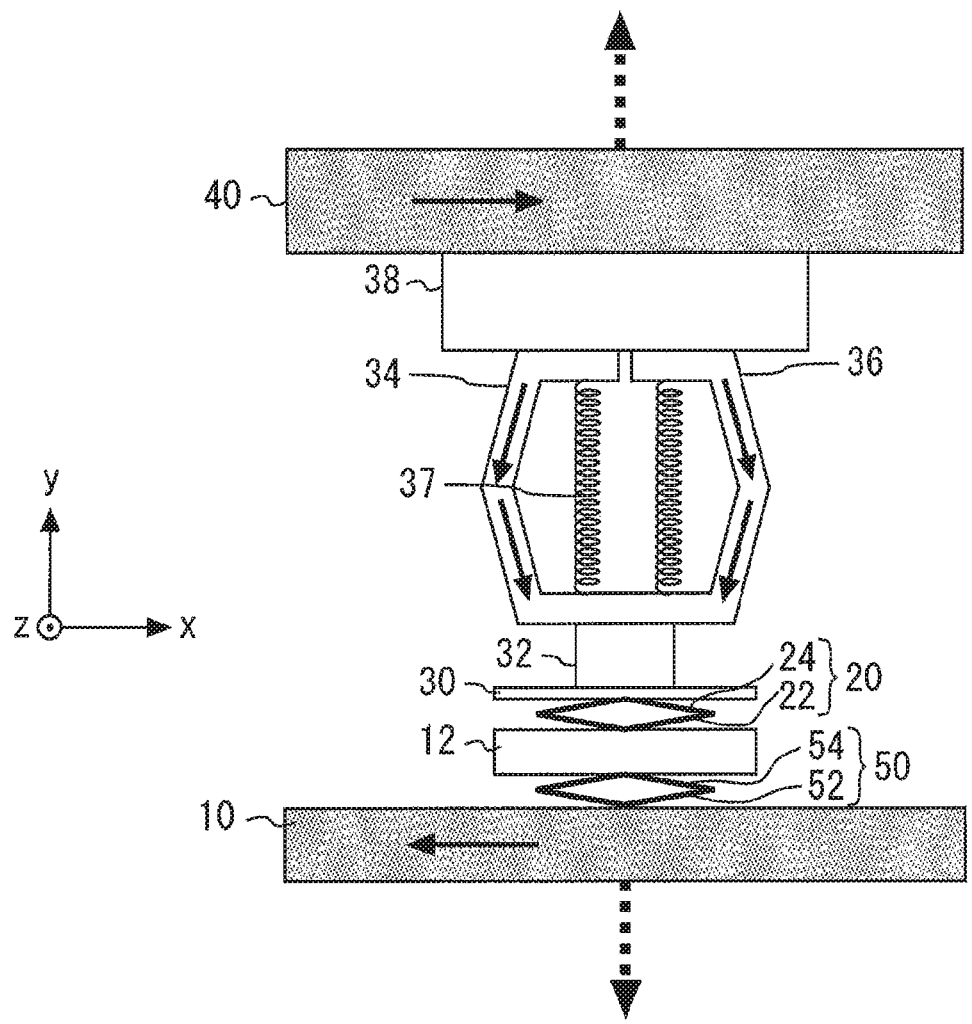
FIG. 9 is a cross-sectional view of a semiconductor device according to Embodiment 4.

FIG. 9 is a cross-sectional view of a semiconductor device according to Embodiment 4. A spiral conductor 50 is provided between the semiconductor chip 12 and the lower electrode 10. The spiral conductor 50 includes a lower spiral conductor 52 provided on the lower electrode 10, and an upper spiral conductor 54 provided on the lower spiral conductor 52. The structure of the spiral conductor 50 is the same as the structure of the spiral conductor 20.

In the semiconductor device of Embodiment 4, a plurality of spiral conductors are provided to be overlapped between the lower electrode 10 and the upper electrode 40. The spiral conductor 20 and the spiral conductor 50 may be directly overlapped with each other, or may be overlapped via the semiconductor chip 12 or a plate. Since providing the plurality of spiral conductors can generate attractive forces at a plurality of places in the semiconductor device, the repulsive force exerted on the lower electrode 10 and the upper electrode 40 can be reduced.

While in Embodiment 4 of the present invention, the two spiral conductors 20 and 50 are provided, three or more spiral conductors may be provided in one semiconductor device. Types of the plurality of spiral conductors are not needed to be matched into the same type. For example, the spiral conductor in FIG. 7 may be overlapped with the spiral conductor 20 in FIG. 1.

In Embodiments 1 to 4 above, the directions of flows of currents are defined by forming grooves in the lower spiral conductor and the upper spiral conductor. The number and the shape of the grooves are not specially limited as long as those guide the currents clockwise or counterclockwise in plan view. Notably, the technical features described for the individual embodiments above can be properly combined.

DESCRIPTION OF SYMBOLS

10 lower electrode, 12 semiconductor chip, 20 spiral conductor, 22 lower spiral conductor, 24 upper spiral conductor, 34,36 pressure pad, 40 upper electrode

The invention claimed is:

1. A semiconductor device comprising:
a lower electrode;
an upper electrode provided above the lower electrode in a first direction;
a semiconductor chip provided between the lower electrode and the upper electrode;
a pressure pad provided between the lower electrode and the upper electrode to be overlapped with the semiconductor chip; and
a spiral conductor provided between the lower electrode and the upper electrode to be overlapped with the semiconductor chip and the pressure pad, wherein
the spiral conductor has an upper spiral conductor, and a lower spiral conductor which is in contact with a lower end of the upper spiral conductor and faces the upper spiral conductor,
by forming grooves in the upper spiral conductor and the lower spiral conductor, a direction of a current flowing through the upper spiral conductor coincides with a direction of a current flowing through the lower spiral conductor in plan view, and
in a view in a second direction substantially perpendicular to the first direction:
one of the upper spiral conductor and the lower spiral conductor bends convex in the first direction, and the other of the upper spiral conductor and the lower spiral conductor bends convex in a third direction opposite to the first direction.

2. The semiconductor device according to claim 1, wherein a portion of the upper spiral conductor that has a largest width is brought into contact with a portion of the lower spiral conductor that has a largest width.

3. The semiconductor device according to claim 1, wherein the grooves are formed to be curved.

4. The semiconductor device according to claim 1, wherein a portion of the upper spiral conductor that has a smallest width is brought into contact with a portion of the lower spiral conductor that has a smallest width.

5. The semiconductor device according to claim 1, wherein the grooves are formed to be linear.

6. The semiconductor device according to claim 1, wherein a plurality of the spiral conductors are provided to be overlapped between the lower electrode and the upper electrode.

7. The semiconductor device according to claim 1, wherein the semiconductor chip is formed of a wide bandgap semiconductor.

8. The semiconductor device according to claim 7, wherein the wide bandgap semiconductor is silicon carbide, a gallium nitride-based material, or diamond.

9. The semiconductor device according to claim 2, wherein the grooves are formed to be curved.

10. The semiconductor device according to claim 2, wherein the grooves are formed to be linear.

11. The semiconductor device according to claim 4, wherein the grooves are formed to be linear.

12. The semiconductor device according to claim 2, wherein a plurality of the spiral conductors are provided to be overlapped between the lower electrode and the upper electrode.

13. The semiconductor device according to claim 3, wherein a plurality of the spiral conductors are provided to be overlapped between the lower electrode and the upper electrode.

14. The semiconductor device according to claim 4, wherein a plurality of the spiral conductors are provided to be overlapped between the lower electrode and the upper electrode.

15. The semiconductor device according to claim 5, wherein a plurality of the spiral conductors are provided to be overlapped between the lower electrode and the upper electrode.

* * * * *